United States Patent
Kriz et al.

(10) Patent No.: US 9,312,869 B2
(45) Date of Patent: Apr. 12, 2016

(54) SYSTEMS AND METHODS FOR A WAFER SCALE ATOMIC CLOCK

(71) Applicant: Honeywell International Inc., Morristown, NJ (US)

(72) Inventors: Jeffrey James Kriz, Eden Prairie, MN (US); James L. Tucker, Clearwater, FL (US); Kenneth H. Heffner, Largo, FL (US); Robert Compton, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 179 days.

(21) Appl. No.: 14/059,698

(22) Filed: Oct. 22, 2013

(65) Prior Publication Data

US 2015/0109061 A1   Apr. 23, 2015

(51) Int. Cl.
*H03L 7/26* (2006.01)
*G04F 5/14* (2006.01)

(52) U.S. Cl.
CPC ... *H03L 7/26* (2013.01); *G04F 5/14* (2013.01)

(58) Field of Classification Search
CPC ......................................................... H03L 7/26
USPC ...................................................... 331/3, 94.1
See application file for complete search history.

(56) References Cited

U.S. PATENT DOCUMENTS

| | | | |
|---|---|---|---|
| 7,142,066 B1 | 11/2006 | Hannah et al. | |
| 7,843,977 B2 * | 11/2010 | Johnstone et al. | 372/20 |
| 2005/0236460 A1 | 10/2005 | Abbink et al. | |
| 2006/0022761 A1 * | 2/2006 | Abeles et al. | 331/94.1 |
| 2007/0034809 A1 | 2/2007 | Lal et al. | |
| 2011/0095755 A1 * | 4/2011 | Maki | 324/244.1 |
| 2011/0187466 A1 | 8/2011 | Youngner et al. | |
| 2012/0313717 A1 | 12/2012 | Ridley et al. | |
| 2013/0015920 A1 * | 1/2013 | Sato et al. | 331/94.1 |

FOREIGN PATENT DOCUMENTS

| | | |
|---|---|---|
| JP | 2009232335 | 10/2009 |
| WO | 2006036268 | 4/2006 |

OTHER PUBLICATIONS

Kitching et al., "Microfabricated Atomic Frequency References", Jun. 2005, pp. 1-6.

Kwakernaak et al., "Componenets for Batch-Fabricated Chip-Scale Atomic Clocks", "36th Annual Precise Time and Time Interval (PTTI) Meeting", Jun. 2005, pp. 355-368.

(Continued)

*Primary Examiner* — Joseph Chang
*Assistant Examiner* — Jeffrey Shin
(74) *Attorney, Agent, or Firm* — Fogg & Powers LLC

(57) ABSTRACT

Systems and methods for a wafer scale atomic clock are provided. In at least one embodiment, a wafer scale device comprises a first substrate; a cell layer joined to the first substrate, the cell layer comprising a plurality of hermetically isolated cells, wherein separate measurements are produced for each cell in the plurality of hermetically isolated cells; and a second substrate joined to the cell layer, wherein the first substrate and the second substrate comprise electronics to control the separate measurements, wherein the separate measurements are combined into a single measurement.

20 Claims, 4 Drawing Sheets

(56) References Cited

OTHER PUBLICATIONS

Levine, "Invited Review Article: The Statistical Modeling of Atomic Clocks and the Design of Time Scales", "Review of Scientific Instruments 83", Feb. 23, 2012, pp. 1-28.

Wei et al., "Fabrication of Wafer-Level Spherical Rb Vapor Cells for Miniaturized Atomic Clocks by a Chemical Foaming Process", "2012 International Conference on Electronic Packaging Technology & High Density Packaging", 2012, pp. 1639-1641.

Youngner et al., "A Manufacturable Chip-Scale Atomic Clock", "Transducers & Eurosensors '07", Jun. 2007, pp. 39-44.

Intellectual Property Office of the Philippines, "Office Action from PH Application No. 1-2014-000294 mailed Nov. 25, 2014","from Foreign Counterpart of U.S. Appl. No. 14/059,698", Nov. 25, 2014, pp. 1 Published in: PH.

European Patent Office, "Extended European Search Report from EP Application No. 14186056.9 mailed Feb. 1, 2016", from Foreign Counterpart of U.S. Appl. No. 14/059,698, Feb. 1, 2016, pp. 1-12, Published in: EP.

Hulbert, "Arrow-Based On-Chip Alkali Vapor-Cell Development", May 22, 2013, pp. 1-210, Publisher: Brigham Young University, Published in: US.

\* cited by examiner

SYSTEMS AND METHODS FOR A WAFER SCALE ATOMIC CLOCK

BACKGROUND

Chip-Scale Atomic Clocks (CSACs) include a gas cell that contains vapors of an alkali metal such as rubidium (Rb). The cell also typically contain a buffer gas, such as an argon-nitrogen buffer gas blend. Typically, RF modulated, polarized light is shined into the cells to interrogate the vapors to acquire a measurement of the resonance frequency of the atoms that constitute the vapors. The CSACs can be used in precision timing systems to improve the precision of positional location devices such as hand held GPS. Though impressively small, CSACs are too large for some low profile applications.

SUMMARY

Systems and methods for a wafer scale atomic clock are provided. In at least one embodiment, a wafer scale device comprises a first substrate; a cell layer joined to the first substrate, the cell layer comprising a plurality of hermetically isolated cells, wherein separate measurements are produced for each cell in the plurality of hermetically isolated cells; and a second substrate joined to the cell layer, wherein the first substrate and the second substrate comprise electronics to control the separate measurements, wherein the separate measurements are combined into a single measurement.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
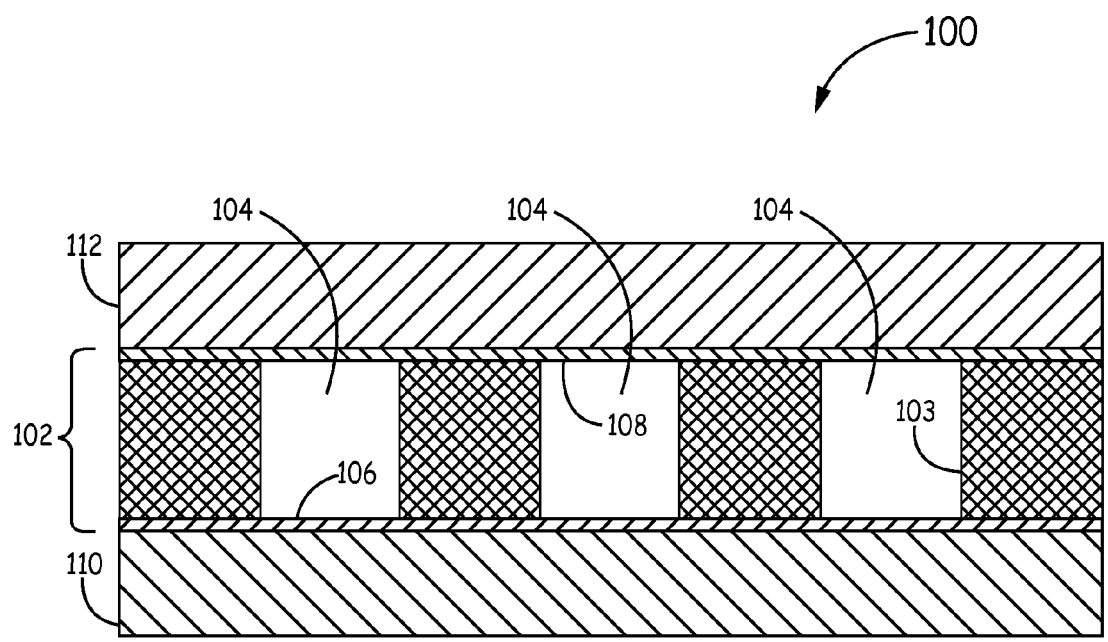
FIG. 1 is a cross sectional diagram of wafer scale device in one embodiment described in the present disclosure.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Embodiments of the present disclosure permit a wafer scale atomic clock that offers a lower profile than what is available with generally available CSAC devices, while achieving precision and yield improvements by using multiple cells of reduced size, where each cell contains resonating material that is measured to provide a resonance signature or other type of measurement. Further, the resonance signatures from the individual cells are averaged together to provide a final measurement for a clock signal. As cells containing oscillating material become smaller, the precision of oscillation measurements may decrease. To increase the precision of measurements, multiple small cells are formed that each provide a different measurement. Individual cells of the array can be tuned for desired independent sensitivities to make the average value more robust to an environment. The different measurements are averaged, where the average measurement is a more accurate measurement of the oscillations of a particular material. Additionally, resonance signatures that differ significantly ("outliers") from the majority of measurements produced from the different cells may be excluded from computations of an average value.

FIG. 1 is a cross sectional diagram of a wafer scale device 100 containing multiple cells 104 formed in a cell layer 102, where the multiple cells 104 each enclose material that resonates at a particular frequency. In one exemplary implementation, the gas mixture within the cells 104 may be temperature stabilized and subjected to a stable magnetic field, and then interrogated to provide measurements such as resonance frequencies. In one exemplary implementation, the resonance frequencies are used to discipline clock oscillations provided by a temperature compensated crystal oscillator (TCXO), where the wafer scale device 100 and the TCXO function together as an atomic clock. In a further example, the material within the cells 104 may contain rubidium, cesium, and the like. To form the cells 104 in the cell layer 102, holes are formed within a wafer layer 103. For example, the wafer layer 103, which can be formed from a silicon material, may have multiple holes that extend through the wafer layer 103. The wafer layer 103 may then be hermetically bonded to a first layer 106. When the wafer layer 103 is joined to the first layer 106, material may be deposited within the multiple cells 104. When material is deposited within the multiple cells 104, a second layer 108 may be hermetically joined to the wafer layer 103 on a side of the wafer layer 103 that is opposite from the first layer 106. In at least one implementation, the bonding of the first layer 106 and the second layer 108 to the wafer layer 103 hermetically seals material within the multiple cells 104 and forms the cell layer 102. In certain embodiments, a first substrate 110 and a second substrate 112 may be joined to opposite sides of the cell layer 102 to provide functional and structural support for the operation of the wafer scale device 100.

In embodiments described herein, the multiple cells 104 may be small enough to be formed as part of a wafer. In at least one implementation, the cell layer 102 is approximately 30 mils thick. Due to the small size of the cells 104, the precision of measurements that can be produced from a single cell in the multiple cells 104 is negatively affected by the small size of the cells. However, the combination of multiple measurements produced by the multiple cells 104 can produce measurements with increased precision. As the cell layer 102, first layer 106, and the second layer 108 are thin, the device 100 has a low profile that permits the installation of the wafer scale device 100 in instruments having limited space requirements.

Figure 2:
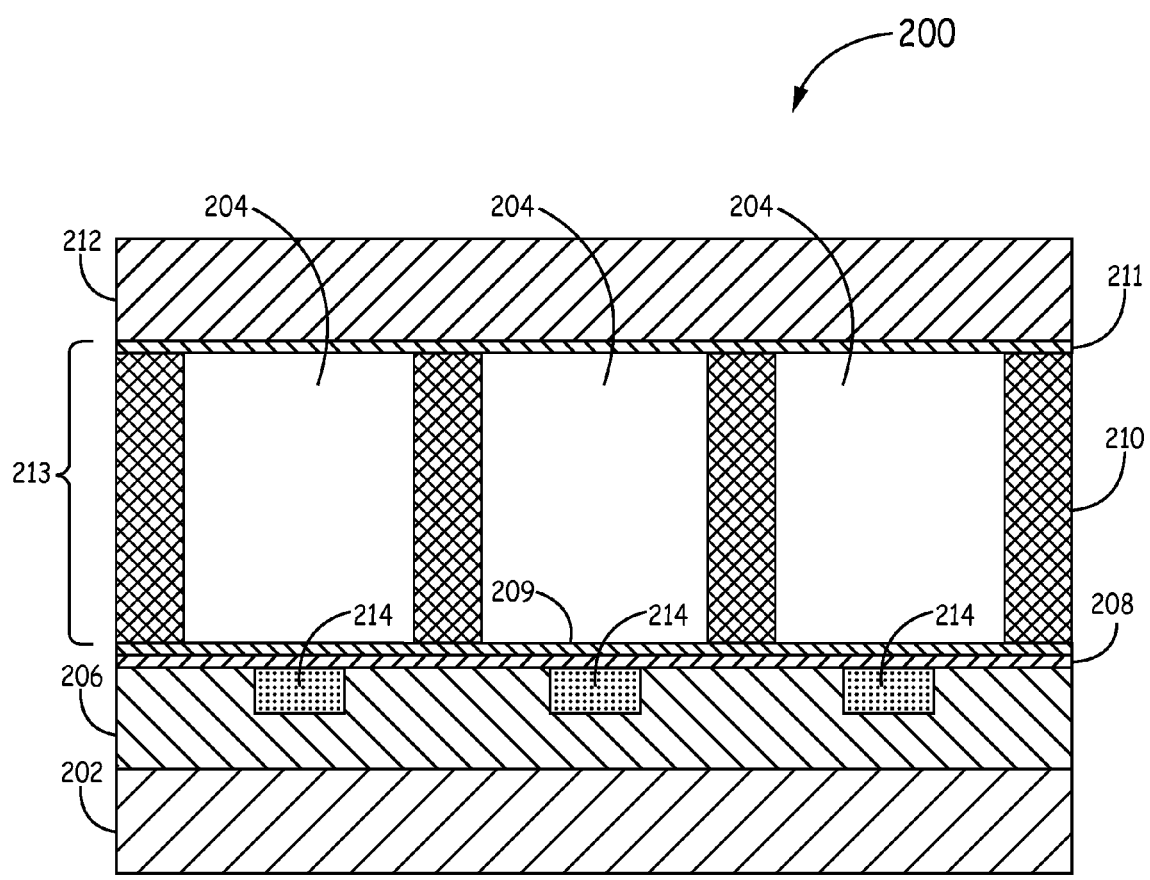
FIG. 2 is a cross sectional diagram of an exemplary wafer scale atomic clock in one embodiment described in the present disclosure.

FIG. 2 is a cross sectional diagram of an exemplary wafer scale atomic clock 200. In a similar manner to device 100 in FIG. 1, the atomic clock 200 includes multiple cells 204 that function in a similar manner to multiple cells 104 described above in FIG. 1. For example, the atomic clock 200 includes three cells 204, that each include a resonating material, that resonates at a resonance frequency, where the resonance frequency of the material can be detected to provide a reference clock for other systems. To fabricate the atomic clock 200, the atomic clock 200 includes multiple wafer layers that are joined together in a manner similar to wafer scale device 100 described above in relation to FIG. 1. For example, the atomic clock 200 includes an electronics layer 202. The electronics layer 202 includes electronics that support the operation of the atomic clock 200. In at least one implementation, the electronics layer 202 is a silicon wafer with CMOS based electronics formed therein.

In a further implementation, the atomic clock 200 includes a light source layer 206. The light source layer 206 includes multiple light sources 214, where each light source 214 emits light into one of the multiple cells 204 in a cell layer 213. For example, the light sources 214 may include individual vertical cavity surface emitting lasers (VCSELs), where each VCSEL emits a laser beam into an associated cell 204. In at least one implementation, the light source layer is fabricated from GaAs. Further, the light source layer 206 may include photodetectors to detect light reflected out of the multiple cells 204 along with associated gain and sampling devices. In one implementation, both the electronics layer 202 and the light source layer 206 each have thicknesses of approximately 10 mils.

In certain embodiments, a quarter wave plate layer 208 is fabricated and joined to the light source layer 206, such that the quarter wave plate layer 208 is between the light source layer 206 and the cell layer 213. For example, the quarter wave plate layer 208 may be a thin layer of birefringent crystal material, such as quartz. Alternatively, the quarter wave plate layer 208 may include a layer of glass having metallization patterns formed as a quarter wave plate line array on a surface of the glass. The light emitted from the multiple light sources 214 passes through the planar quarter wave plate in the quarter wave plate layer 208 before it enters a cell 204 in the cell layer 213. As light passes through the quarter wave plate layer 208, a wave interference is formed that causes the light to become circularly polarized. The polarized light continues through the gas mixture in the cell 204 and is reflected from the surface of a light control layer 212. The reflected light then passes back through the gas mixture in the cell 204 and through the quarter wave plate layer 208, where the light impinges on photodetectors that are also located in the light source layer 206. In certain implementations, the first substrate 110 in FIG. 1 includes the electronics layer 202, the light source layer 206, and the quarter wave plate layer 208.

As stated above in regards to FIG. 1, the cell layer 213 is fabricated by forming cells in a silicon wafer and hermetically sealing a gas mixture within the cells. In one exemplary implementation, to form the cell layer 213, cells are hollowed out within a wafer layer 210. In at least one implementation, the wafer layer 210 is fabricated from a silicon wafer. When the cells are hollowed out, the wafer layer 210 is anodically bonded to a first glass layer 209 to form a cup like repository in which a metal or liquid may be placed. For example, the first glass layer 209 is anodically bonded to one of the sides of the wafer layer 210 so that one of the sides of the cells 204 is sealed. When the first glass layer 209 is bonded to the wafer layer 210, a solid or liquid is placed within the cells 204. For example, rubidium or cesium is placed within the cells 204. When the solid is placed within the cells 204, a second glass layer 211 is bonded to the wafer layer 210 on the open side of the wafer layer 210 to hermetically seal the cells 204. For example, the second glass layer 211 is anodically bonded to the side of the wafer layer 210 that is opposite to the side of the wafer layer 210 that is bonded to the first glass layer 209. When the cells are formed, the wafer layer 210 is bonded to the second glass layer 211 in the presence of a vacuum. Alternatively, the wafer layer 210 is bonded to the second glass layer 211 in the presence of a buffer gas that is at a low pressure. When the wafer layer 210 is bonded to the second glass layer 211 in the presence of a buffer gas, the buffer gas functions to prevent the atoms that outgas from the solid or liquid from colliding with the walls of the cells 204 at high speeds. When the wafer layer 210 is bonded to the first glass layer 209 and the second glass layer 208 to form the cell layer 213, the solid/liquid material becomes a gas due to the lower pressure of the buffer gas and exposure of the atomic clock to heat.

In a further embodiment, the atomic clock 200 includes a light control layer 212. In at least one implementation the light control layer 212 is metalized reflector. When the light control layer 212 is a metalized reflector, the light control layer 212 reflects light that leaves a cell 204 in the cell layer 213 back into the cell 204. Alternatively, the light control layer 212 is a CMOS electronic substrate that includes photodetectors, amplifiers, and sampling devices. When the light control layer 212 is a CMOS electronic substrate, the photodetectors detect light that leaves the cell 204 that is incident on the photodetectors.

In certain embodiments, the different layers in the atomic clock 200, the electronics layer 202, the light source layer 206, the quarter wave plate layer 208, the cell layer 213, and the light control layer 212 are fabricated separately and then bonded together as a stacked wafer to form the atomic clock 200. For example, the different layers are joined together through thermocompression, thermo sonic compression, solder ball bumps, and the like. In at least one implementation, the different layers are joined together without using epoxies or solders that contain organics. The avoidance of epoxies and solders with organics also avoids outgassing that can occur when certain bonding materials are exposed to a vacuum over time. In a further implementation, getters can be used to absorb the gas that results from outgassing materials. When the atomic clock 200 is manufactured, the atomic clock 200 can be mounted inside a wafer scale physics package.

Figure 3:
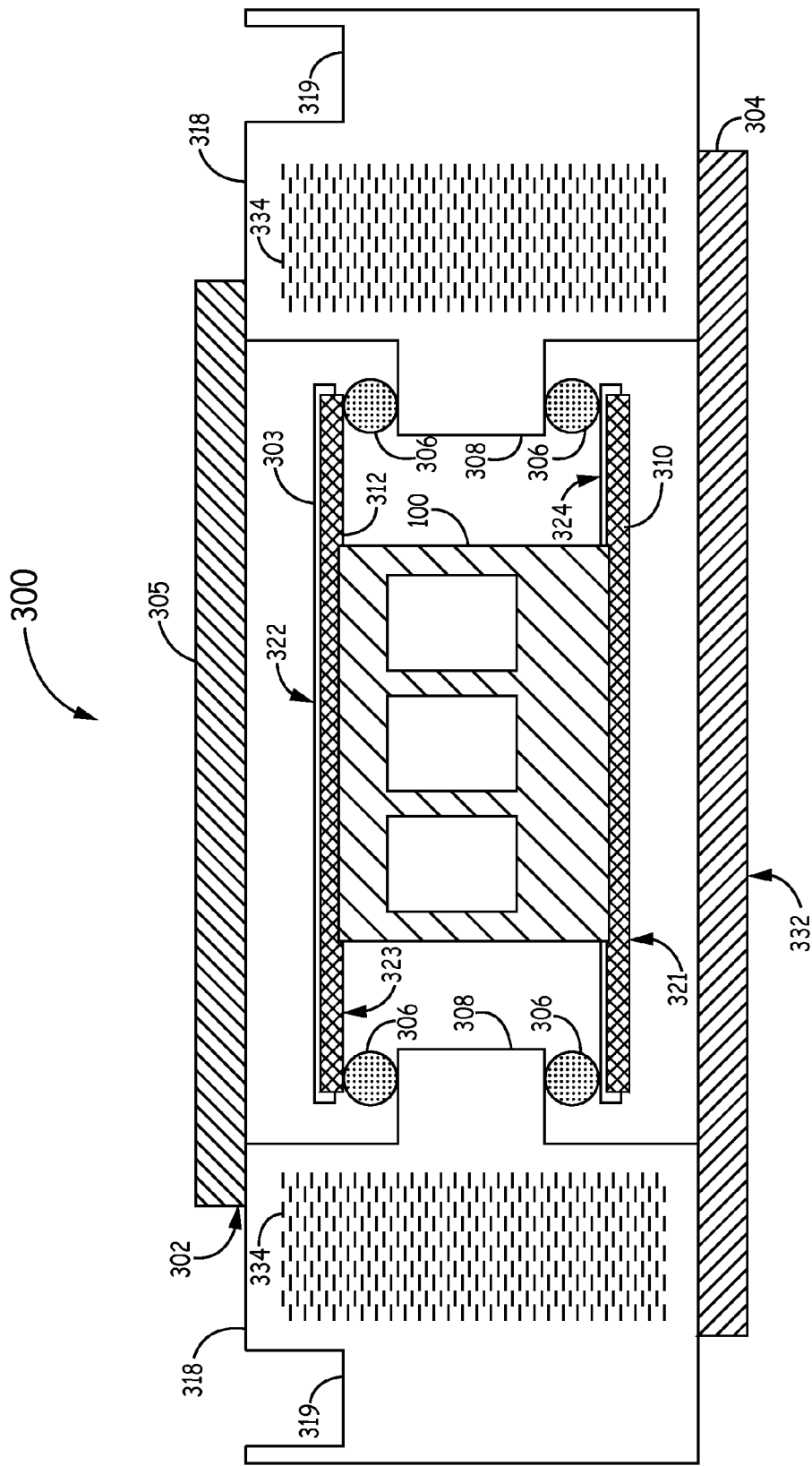
FIG. 3 is a cross-sectional view of a wafer scale physics package for a wafer scale device in one embodiment described in the present disclosure.

FIG. 3 is a cross-sectional view of a wafer scale physics package 300 for a wafer scale device 100. The physics package 300 can include a ceramic housing 302 defining a cavity 303 for housing components of the wafer scale physics package 300 that includes the wafer scale device 100 described above in FIG. 1 (which may be an atomic clock 200 as described above in FIG. 2). The ceramic housing 302 including the components in the cavity 303 can include a low temperature co-fired ceramic (LTCC) package. The wafer scale physics package 300 can also include a first non-magnetic (e.g., ceramic) lid 304 and a second non-magnetic lid 305 configured to enclose the cavity 303 of the ceramic body 302 to form a closed package encasing the cavity 303 and the components therein. In an example, the lids 304 and 305 have a generally planar shape. Alternatively, high permeability metal can be used for items 304 and 305 forming a hermetic/vacuum enclosure that forms part of an external metal shield around the wafer level physics package 300.

The first lid 304 and the second lid 305 can be mounted on opposite sides of one or more spacers 318 (e.g., leg structure, washer). Further, within the cavity 303, a first scaffold 310 and a second scaffold 312 can function as a support structure for the wafer scale device 100. The first scaffold 310 and the second scaffold 312 are mounted to a flange 308 on the spacers 318. For example, solder bumps 306 are used to join the first scaffold 310 and the second scaffold to the flange 308 on the spacers 318. Accordingly, the wafer scale device 100 attaches to the first scaffold 310 on one end and the second scaffold 312 on the opposite end. As the first scaffold 310 and the second scaffold 312 are supported by the flange 308 on the spacer 318, the wafer scale device 100 can be disposed within an aperture of the spacer 318. In an example, the spacer 318 can have a ring shape (e.g., a pentagon ring shape) defining an aperture therein. The spacer 318 can be disposed around the wafer scale device 100 such that the wafer scale device 100 is within the aperture enclosed by the spacer 318.

In at least one implementation, the first lid 304 and the second lid 305 may be bonded to the spacer 318 with a solder seal. In at least one example, die attach and sealing operations for sealing the lids 304 and 305 to the spacers 318 are accomplished without the use of flux to enable low pressure in the sealed package which can enable lower power operation. In an example, the lid 304 can be sealed to the body 302 in a vacuum. The physics package 300 can also include a getter film coating most of the interior surface of the first lid 304 and the second lid 305. Also, a getter film may coat portions of the first scaffold 310 and the second scaffold 312. To produce the scaffolds 310 and 312 at a size that can be used for the physics package 300, the scaffolds 310 and 312 can be fabricated using semiconductor fabrication processes.

In an example, the spacer 318 can also function to reduce fatigue on the joint(s) coupling the first scaffold 310 and the second scaffold 312 to the flange 308 and the first lid 304 and the second lid 305 to the spacer 318. The spacer 318 can reduce fatigue by being composed of a material that has a thermal expansion coefficient that is in between the thermal expansion coefficient of the lids 304 and 305 and the thermal expansion coefficient of the scaffolds 310 and 312. Accordingly, as the lids 304 and 305 and the scaffolds 310 and 312 expand and contract due to temperature changes, the spacer 318 can absorb some of the changes. In another example, the spacer 318 can be formed of the same material as the lids 304 and 305. The spacer 318 can also provide electrical contacts for the scaffolds 310 and 312, which in turn provide electrical contacts to the wafer scale device 100.

The first scaffold 310 can include a first side 321 that opposes the lid 304 and a second side 324 that is reverse of the first side 321 and facing the second scaffold 312. In an example, the wafer scale device 100 is mounted to the second side 324. Also, the second scaffold 312 is in a flipped position with respect to the first scaffold 310. That is, the second scaffold 312 includes a first side 322 that opposes the lid 305 and a second side 323 that is reverse of the first side 321 and facing the first scaffold.

In at least one exemplary embodiment, a magnetic solenoid coil 334 can be disposed about (e.g., within) the spacer 318 such that the magnetic coil extends around the wafer scale device 100. The magnetic coil 334 can be configured to provide a bias field for the wafer scale device 100. In an example, the magnetic coil 334 can be integrated into (e.g., internal to) the spacer 318 formed from multiple ceramic layers. In a further implementation, the spacer 318 may have recesses 319 formed therein, where the recesses 319 hold die or chip scale integrated circuit packages. For example, RF components and a mircroprocessors mounted within the recesses 319 may allow the clock to be held within a single ceramic that is able to perform functions that both control the operation of the atomic clock and the control the averaging of measurements from the multiple cells.

In at least one implementation, the first lid 304 includes an input/output (I/O) solder pad 332 on an external portion of the first lid 304. Alternatively, the I/O solder pad 332 is located on an external portion of the second lid 305. As a further alternative, spacer 318 can be extended to provide sufficient room to accommodate solder balls or stud attachment from a circuit board directly to the spacer 318. Thus, a portion of the physics package 300 can be attached to a circuit board. In an example, interconnects between the I/O solder pad 332 and internal components found in the wafer scale device 100 can be routed through the body of the physics package 300. For examples, interconnects on the scaffolds 310 and 312 can be routed through the spacer 318 to the I/O solder pads 332. Thus, the spacer 318 can include electrical traces on an internal or external portion thereof.

In an example, to manufacture the physics package 300 the scaffolds 310 and 312, spacer 318, and lids 304 and 305 can be formed and combined together. The scaffolds can be created and assembled at the wafer level. Once created, a first scaffold 310 can be mounted to flanges 308 of the spacer 318. When the first scaffold 310 is mounted to the flanges 308 of the spacer 318, the wafer scale device 100 can be mounted to the first scaffold 310 and the second scaffold 312 can be mounted to the flanges 308 of the spacer 318 and the wafer scale device 100 to secure the wafer scale device 100 in relation to the spacer 318. When both of the scaffolds 310 and 312 are secured to the flange 308 of the spacer 318, lids 304 and 305 are mounted to the spacer 318. In at least one embodiment, the components are attached using a solder, an epoxy, thermosonic bonding, or other die attach method.

In at least one implementation, temperature regulating devices are fabricated on the first scaffold 310 and the second scaffold 312 to control the temperature of the gas within the cells 204. For example, the temperature regulating device may include a heating element, a thermocouple, a Wheatstone bridge, and the like. Alternatively, the temperature regulating devices may be fabricated within the light control layer 212 and/or the electronics layer 202. The temperature regulating devices connect to external electronics that control the power generated by the temperature regulating devices. Further, each cell in the cell layer 213 may be associated with a different temperature regulating device, such that the temperature of each cell can be individually controlled. Also, the thermal tuning may be used for signal quantization, wave forming, and digitization to apply to encryption and hardware security of signals produced by the physics package 300.

In operation, electronics in the electronics layer 202 in FIG. 2 communicate with external systems through the I/O solder pads 332 in FIG. 3. Through these electrical communications, the electronics on the electronics layer 202 control the emission of light from the light source layer 206 into the separate cells 204. The light interrogates the gas (e.g. rubidium gas) in the cells 204 and reflections from the gas are detected by either photodetectors in the light source layer 206 or photodetectors in the light control layer 212. The electrical signals created by the photodetectors are then amplified and sampled and transmitted out of the physics package 300 through the I/O solder pads 332, where an external system determines the resonance frequency of the gas within the cells 204.

As there are multiple cells, an external system averages the different resonant frequency measurements associated with the different cells together to determine an average resonant frequency for the wafer scale device 100. By averaging the different measurements from the different cells, the wafer scale device 100 can produce more accurate measurements than can be produced by a single cell. For example, when there are N cells, the averaging of the different measurements can provide an precision improvement equal to $1/\sqrt{N}$. If a wafer scale device 100 included 100 cells, the wafer scale device would have an improved precision of 0.1 over a single cell. Due to the increased precision of multiple cells, the individual cells can be smaller, thus decreasing the profile of the physics package 300. The decreased profile of the physics package 300 allows the physics package 300 to be installed in devices having tight space limitations.

In a further embodiment, the wafer scale device 100 may also be fabricated from radiation hardened parts. For example, the electronic components in the different layers may be radiation hardened. Also, when components associated with a particular cell fail, the wafer scale device 100 may isolate the failure to the single cell, where the wafer scale device 100 still operates using the measurements from the cells that continue to operate correctly.

The physics package 300 can also be implemented as described in co-pending U.S. patent application Ser. No. 13/327,417 entitled "VAPOR CELL ATOMIC CLOCK PHYSICS PACKAGE" filed on Dec. 15, 2011, herein incorporated in its entirety by reference.

Figure 4:
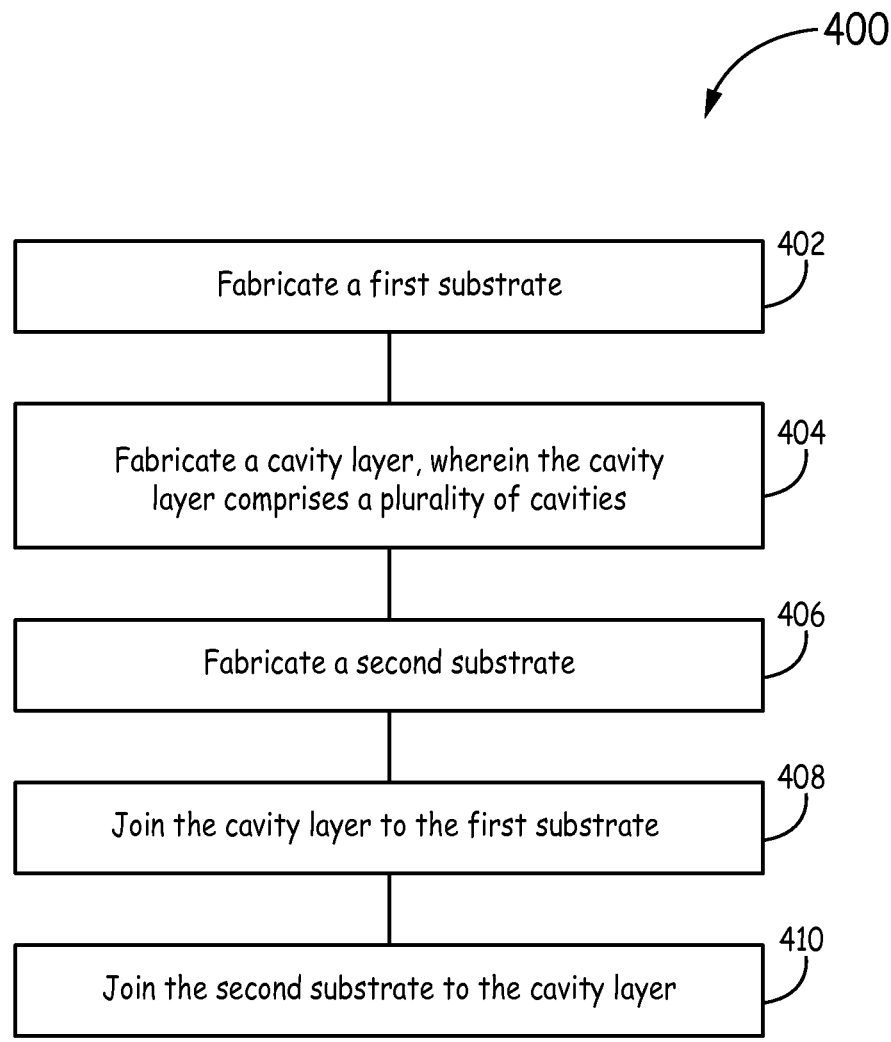
FIG. 4 is a flow diagram illustrating a method for fabricating a wafer scale device in one embodiment described in the present disclosure.

FIG. 4 is a flow diagram illustrating a method 400 for fabricating a wafer scale device according to at least one embodiment. Method 400 proceeds at 402 where a first substrate is fabricated. For example, the first substrate may comprise multiple layers that aid in the functioning of the wafer scale device. In at least one implementation, the first substrate includes an electronics layer that provides access to control over the wafer scale device. The first substrate also includes a light source layer that can emit light into different cells. Further, the first substrate includes a quarter wave plate layer that can change the polarization of light emitted by the light source layer.

Method 400 proceeds at 404, where a cell layer is fabricated, wherein the cell layer comprises a plurality of cells. In certain embodiments, fabricating the cell layer includes forming a first glass layer and forming a wafer layer, where the wafer layer has the plurality of cells formed therein, also the plurality of cells extend from a first side of the wafer layer to an opposing second side of the wafer layer. Fabricating the wafer layer also includes forming a second glass layer, bonding the first glass layer to the first side of the wafer layer, depositing matter in the plurality of cells, and bonding the second glass layer to the opposing second side of the wafer layer.

Method 400 proceeds at 406, where a second substrate is fabricated. In at least one exemplary implementation, the second substrate is a layer that includes a metallic reflector on one side of the second substrate. Alternatively, the second substrate includes photodetectors, gain electronics and sampling electronics. Method 400 proceeds at 408, where the cell layer is joined to the first substrate. For example, the first substrate is joined to the cell layer such that light emitted from the light source layer in the first substrate passes into the cells in the plurality of cells. Method 400 proceeds at 408, where the second substrate is joined to the cell layer. For example, the second layer is joined to the cell layer such that the second substrate either detects light that passes through the plurality of cells or reflects light that passes through the plurality of cells back into the cells. In certain embodiments, the first and second substrates include electrical connections to communicate measurements to an external device, wherein the external device is configured to calculate an average for the separate measurements.

EXAMPLE EMBODIMENTS

Example 1 includes a wafer scale device, the wafer scale device comprising: a first substrate; a cell layer joined to the first substrate, the cell layer comprising a plurality of hermetically isolated cells, wherein separate measurements are produced for each cell in the plurality of hermetically isolated cells; and a second substrate joined to the cell layer, wherein the first substrate and the second substrate comprise electronics to control the separate measurements, wherein the separate measurements are combined into a single measurement.

Example 2 includes the wafer scale device of Example 1, wherein the first substrate comprises: an electronics layer; and a light source layer joined to the first electronics layer, wherein electronics in the first electronics layer control the emission of light from at least one light source in the light source layer, wherein the at least one light source interrogates matter in separate cells in the plurality of hermetically isolated cells.

Example 3 includes the wafer scale device of Example 2, wherein the matter comprises at least one of: alkali atoms; and one or more buffer gases.

Example 4 includes the wafer scale device of any of Examples 2-3, wherein the first substrate further comprises at least one of a quarter wave plate layer configured to circularly polarize the light emitted from the plurality of light sources before the light enters the plurality of hermetically isolated cells and at least one heating element and at least one thermocouple, wherein the at least one heating element and the at least one thermocouple enable individual temperature regulation of individual cells in the plurality of hermetically isolated cells.

Example 5 includes the wafer scale device of any of Examples 2-4, wherein the second substrate comprises: a metalized reflector to reflect the light emitted from the at least one light source that passes through the plurality of hermetically isolated cells back into the plurality of hermetically isolated cells.

Example 6 includes the wafer scale device of any of Examples 2-5, wherein the light source layer further comprises a plurality of photodetectors to detect light reflected from the plurality of hermetically isolated cells.

Example 7 includes the wafer scale device of any of Examples 2-6, wherein the second substrate comprises at least one of: a plurality of photodetectors to detect light emitted from the at least one light source that passes through the plurality of hermetically isolated cells; and at least one temperature regulating device configured to enable individual temperature regulation of individual cells in the plurality of hermetically isolated cells.

Example 8 includes the wafer scale device of any of Examples 1-7, wherein the first substrate, the cell layer, and the second substrate are joined together through at least one of: thermocompression bonding; oxide bonding; thermosonic compression; and solder bumps.

Example 9 includes the wafer scale device of any of Examples 1-8, wherein the single measurement comprises an average of the separate measurements, wherein measurements in the separate measurements that are outliers are removed from the computation of the average.

Example 10 includes the wafer scale device of any of Examples 1-9, wherein the wafer scale device is mounted within a hermetically sealed package.

Example 11 includes the wafer scale device of Example 10, wherein the hermetically sealed package is comprised of at least one of: a low temperature co-fired ceramic; an input/output pad for transmitting and receiving electrical communications; a high permeability magnetic shield enclosure around the wafer scale device; control circuitry configured to control the operation of the wafer scale device; and at least one temperature regulating device configured to enable individual temperature regulation of individual cells in the plurality of hermetically isolated cells.

Example 12 includes a wafer scale atomic clock, the atomic clock comprising: an electronics layer; a light source layer joined to the first electronics layer, wherein electronics in the first electronics layer control the emission of light from at least one light source in the light source layer; a cell layer joined to the light source layer, the cell layer comprising a plurality of cells, wherein the at least one light source emits light into the separate cells in the plurality of cells; and a light control layer joined to the cell layer, wherein light within the plurality of cells is incident on the light control layer.

Example 13 includes the wafer scale atomic clock of Example 12, wherein the cell layer comprises: a first glass layer; a wafer layer having the plurality of cells formed therein, wherein the plurality of cells extend from a first side of the wafer layer to an opposing second side of the wafer layer, wherein the first glass layer is bonded to a first side of the wafer layer, wherein matter is deposited in each cell in the plurality of cells; and a second glass layer bonded to the opposing second side, wherein the separate cells in the plurality of cells are hermetically isolated.

Example 14 includes the wafer scale atomic clock of Example 13, wherein the first glass layer is anodically bonded to the wafer layer, and the second glass layer is anodically bonded to the wafer layer.

Example 15 includes the wafer scale atomic clock of any of Examples 12-14, wherein the at least one light source acquires separate measurements from the separate cells, wherein the separate measurements are averaged together to provide a single measurement.

Example 16 includes the wafer scale atomic clock of any of Examples 12-15, wherein the light control layer comprises a reflective surface that reflects light that passes through the plurality of cells back into the plurality of cells.

Example 17 includes the wafer scale atomic clock of any of Examples 12-16, wherein the light source layer includes a plurality of photodetectors to detect the light that is reflected back towards the light source layer.

Example 18 includes the wafer scale atomic clock of any of Examples 12-17, wherein the light control layer comprises a photodetector to detect light that passes through the plurality of cells.

Example 19 includes a method for fabricating a wafer scale device, the method comprising: fabricating a first substrate; fabricating a cell layer, wherein the cell layer comprises a plurality of cells; fabricating a second substrate; joining the cell layer to the first substrate such that the first substrate is able to provide separate measurements for each cell in the plurality of cells; and joining the second substrate to the cell layer, wherein the first substrate and the second substrate comprise electronics to control the separate measurements, wherein the separate measurements are averaged to form a single measurement.

Example 20 includes the method of Example 19, wherein fabricating the cell layer comprises: forming a first glass layer; forming a wafer layer, the wafer layer having the plurality of cells formed therein, wherein the plurality of cells extend from a first side of the wafer layer to an opposing second side of the wafer layer; forming a second glass layer; bonding the first glass layer to the first side of the wafer layer; depositing matter in the plurality of cells; and bonding the second glass layer to the opposing second side of the wafer layer.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A wafer scale device, the wafer scale device comprising:
   a first substrate;
   a cell layer joined to the first substrate, the cell layer comprising a plurality of hermetically isolated cells, wherein separate measurements are produced for each cell in the plurality of hermetically isolated cells; and
   a second substrate joined to the cell layer opposite the first substrate, wherein the first substrate and the second substrate comprise electronics to control the separate measurements, wherein the separate measurements are combined into a single measurement.

2. The wafer scale device of claim 1, wherein the first substrate comprises:
   an electronics layer; and
   a light source layer joined to the first electronics layer, wherein electronics in the electronics layer control the emission of light from at least one light source in the light source layer, wherein the at least one light source interrogates matter in separate cells in the plurality of hermetically isolated cells.

3. The wafer scale device of claim 2, wherein the matter comprises at least one of:
   alkali atoms; and
   one or more buffer gases.

4. The wafer scale device of claim 2, wherein the first substrate further comprises at least one of
   a quarter wave plate layer configured to circularly polarize the light emitted from the plurality of light sources before the light enters the plurality of hermetically isolated cells and
   at least one heating element and at least one thermocouple, wherein the at least one heating element and the at least one thermocouple enable individual temperature regulation of individual cells in the plurality of hermetically isolated cells.

5. The wafer scale device of claim 2, wherein the second substrate comprises:
   a metalized reflector to reflect the light emitted from the at least one light source that passes through the plurality of hermetically isolated cells back into the plurality of hermetically isolated cells.

6. The wafer scale device of claim 2, wherein the light source layer further comprises a plurality of photodetectors to detect light reflected from the plurality of hermetically isolated cells.

7. The wafer scale device of claim 2, wherein the second substrate comprises at least one of:
   a plurality of photodetectors to detect light emitted from the at least one light source that passes through the plurality of hermetically isolated cells; and
   at least one temperature regulating device configured to enable individual temperature regulation of individual cells in the plurality of hermetically isolated cells.

8. The wafer scale device of claim 1, wherein the first substrate, the cell layer, and the second substrate are joined together through at least one of:
   thermocompression bonding;
   oxide bonding;
   thermosonic compression; and
   solder bumps.

9. The wafer scale device of claim 1, wherein the single measurement comprises an average of the separate measurements, wherein measurements in the separate measurements that are outliers are removed from the computation of the average.

10. The wafer scale device of claim 1, wherein the wafer scale device is mounted within a hermetically sealed package.

11. The wafer scale device of claim 10, wherein the hermetically sealed package is comprised of at least one of:
- a low temperature co-fired ceramic;
- an input/output pad for transmitting and receiving electrical communications;
- a high permeability magnetic shield enclosure around the wafer scale device;
- control circuitry configured to control the operation of the wafer scale device; and
- at least one temperature regulating device configured to enable individual temperature regulation of individual cells in the plurality of hermetically isolated cells.

12. A wafer scale atomic clock, the atomic clock comprising:
- an electronics layer;
- a light source layer joined to the electronics layer, wherein electronics in the electronics layer control the emission of light from at least one light source in the light source layer;
- a cell layer joined to the light source layer, the cell layer comprising a plurality of cells, wherein the at least one light source emits light into the separate cells in the plurality of cells; and
- a light control layer joined to the cell layer opposite the light source layer, wherein light within the plurality of cells is incident on the light control layer and the light control layer comprises electronics.

13. The wafer scale atomic clock of claim 12, wherein the cell layer comprises:
- a first glass layer;
- a wafer layer having the plurality of cells formed therein, wherein the plurality of cells extend from a first side of the wafer layer to an opposing second side of the wafer layer, wherein the first glass layer is bonded to a first side of the wafer layer, wherein matter is deposited in each cell in the plurality of cells; and
- a second glass layer bonded to the opposing second side, wherein the separate cells in the plurality of cells are hermetically isolated.

14. The wafer scale atomic clock of claim 13, wherein the first glass layer is anodically bonded to the wafer layer, and the second glass layer is anodically bonded to the wafer layer.

15. The wafer scale atomic clock of claim 12, wherein the at least one light source acquires separate measurements from the separate cells, wherein the separate measurements are averaged together to provide a single measurement.

16. The wafer scale atomic clock of claim 12, wherein the light control layer comprises a reflective surface that reflects light that passes through the plurality of cells back into the plurality of cells.

17. The wafer scale atomic clock of claim 12, wherein the light source layer includes a plurality of photodetectors to detect the light that is reflected back towards the light source layer.

18. The wafer scale atomic clock of claim 12, wherein the light control layer comprises a photodetector to detect light that passes through the plurality of cells.

19. A method for fabricating a wafer scale device, the method comprising:
- fabricating a first substrate;
- fabricating a cell layer, wherein the cell layer comprises a plurality of cells;
- fabricating a second substrate;
- joining the cell layer to the first substrate such that the first substrate is able to provide separate measurements for each cell in the plurality of cells; and
- joining the second substrate to the cell layer opposite the first substrate, wherein the first substrate and the second substrate comprise electronics to control the separate measurements, wherein the separate measurements are averaged to form a single measurement.

20. The method of claim 19, wherein fabricating the cell layer comprises:
- forming a first glass layer;
- forming a wafer layer, the wafer layer having the plurality of cells formed therein, wherein the plurality of cells extend from a first side of the wafer layer to an opposing second side of the wafer layer;
- forming a second glass layer;
- bonding the first glass layer to the first side of the wafer layer;
- depositing matter in the plurality of cells; and
bonding the second glass layer to the opposing second side of the wafer layer.

* * * * *